United States Patent
Dhong et al.

[11] Patent Number: 6,060,759
[45] Date of Patent: May 9, 2000

[54] METHOD AND APPARATUS FOR CREATING IMPROVED INDUCTORS FOR USE WITH ELECTRONIC OSCILLATORS

[75] Inventors: Sang Hoo Dhong; Uttam Shymalindu Ghoshal; Kyung Tek Lee, all of Austin, Tex.

[73] Assignee: International Business Machines Corporation, Armonk, N.Y.

[21] Appl. No.: 09/036,187

[22] Filed: Mar. 6, 1998

[51] Int. Cl.[7] .................................................. H01L 29/00
[52] U.S. Cl. .......................... 257/531; 336/200; 438/381
[58] Field of Search .................................... 257/531, 532; 336/200; 438/381

[56] References Cited

U.S. PATENT DOCUMENTS

| | | | |
|---|---|---|---|
| 3,290,758 | 12/1966 | Moyer | 29/155.5 |
| 3,305,814 | 2/1967 | Moyer | 336/200 |
| 3,614,554 | 10/1971 | Shield et al. | 317/235 R |
| 3,988,764 | 10/1976 | Cline et al. | 357/51 |
| 5,070,317 | 12/1991 | Bhagat | 336/200 |
| 5,336,921 | 8/1994 | Sundaram et al. | 257/531 |
| 5,372,967 | 12/1994 | Sundaram et al. | 437/60 |
| 5,861,647 | 1/1999 | Zhao et al. | 257/531 |
| 5,872,489 | 2/1999 | Chang et al. | 257/531 |

FOREIGN PATENT DOCUMENTS 6089976   3/1994   Japan ............................. H01L 27/06

*Primary Examiner*—Mark V. Prenty
*Attorney, Agent, or Firm*—Casimer K. Salys; Andrew J. Dillon

[57] ABSTRACT

The present invention relates, in general, to a method and apparatus for creating improved inductors which can be adapted for use with electronic oscillators. The method includes at least the following: forming a first coil; forming a second coil, such that the second coil is proximate to the first coil and such that a magnetic flux from the formed outer coil will link with a magnetic flux of the formed second coil; and connecting the first coil to the second coil in electrical parallel. The apparatus includes at least the following: a substrate; and a composite inductor having at least a first coil with an associated inductance and resistance and a second coil with an associated inductance and resistance, with the first coil and the second coil connected in electrical parallel but formed in the substrate such that said composite inductor has resistance substantially less than the combined resistances associated with the first coil and the second coil. The composite inductor further includes the first coil and second coil connected in electrical parallel but formed in the substrate such that the composite inductor has inductances substantially equivalent to the combined inductances associated with the first coil and the second coil. The apparatus can be utilized to form an oscillator implemented in an integrated circuit.

25 Claims, 5 Drawing Sheets

METHOD AND APPARATUS FOR CREATING IMPROVED INDUCTORS FOR USE WITH ELECTRONIC OSCILLATORS

BACKGROUND OF THE INVENTION

1. Field of the Invention

The present invention relates, in general, to a method and apparatus for creating improved inductors capable of being operated at relatively low voltage levels and further capable of being implemented on an integrated circuit chip. Specifically, the present invention relates to a method and apparatus for creating improved inductors, capable of being operated at relatively low voltage levels and further capable of being implemented on an integrated circuit chip, and which can be adapted for use with an electronic oscillator and thereby provide an improved Q factor for the electronic oscillator.

2. Description of Related Art

An electronic oscillator is a device or circuit that produces a periodically varying output at a controlled frequency. The electronic oscillator's output can be either voltage, current, or an electromagnetic wave.

Electronic oscillators may be either passive or active. Passive electronic oscillators are electronic circuits composed of passive electrical components. Active electronic oscillators are electronic circuits composed of at least one active electrical component, and any number of passive electrical components. Passive electrical components are those components which cannot independently generate electrical energy. Active electrical components are those components which can independently generate electrical energy.

Ideally (i.e., mathematically), electronic oscillators generate electrical energy precisely at a predefined controlled frequency. Practically (i.e., in the actual physical world), electronic oscillators generate electrical energy concentrated around a predefined controlled frequency; that is, actual (as opposed to mathematical) electronic oscillators do not generate electrical energy precisely at a predefined controlled frequency, but rather tend to generate electrical energy within a "band" of frequencies spanning some predefined controlled frequency range. This is true irrespective of whether passive or active electronic oscillators are considered.

Generally, when either passive or active electronic oscillators are actually built, the objective is to make such actual electronic oscillators approximate, as nearly as possible, their ideal mathematical equivalents. That is, an attempt is made to (1) make the "band" of frequencies spanned by the actual oscillator as narrow as possible, and (2) center that "band" of frequencies as nearly as possible about the predefined controlled centerline frequency of the ideal mathematical electronic oscillators that the actual electronic oscillator is intended to emulate.

Insofar as the objective in building an actual passive or active electronic oscillator is to approximate the actual electronic oscillator's mathematical counterpart, the "quality" of such actual electronic oscillator is assessed relative to how closely such actual electronic oscillator approximates its ideal mathematical counterpart. The "center frequency" of an actual electronic oscillator is defined to be that frequency where the output electrical power of the actual electronic oscillator is at a maximum. The usable "bandwidth" of an actual electronic oscillator is defined to be that range of frequencies, centered about the defined "center frequency," where the output electrical power has dropped to one-half the value of the maximum output electrical power (i.e., the defined "center frequency"). The "quality" of an actual electronic oscillator is described quantitatively in terms of a "Quality Factor" (Q Factor) which is defined to be the ratio of the defined "center frequency" to the defined "bandwidth." In symbols, the Q factor is typically expressed as follows: $Q=\omega_0/(\omega_2-\omega_1)$, where $\omega_0$ stands for the "center frequency" of the oscillator, and $(\omega_2-\omega_1)$ stands for the "bandwidth" of the oscillator.

With respect to actual oscillator design, then, the objective is to build an oscillator with as high a "quality," or Q Factor, as is practicable, since the higher the Q Factor, the more closely the actual oscillator approximates a mathematically ideal oscillator. As defined, the Q Factor is a mathematical formula requiring both the defined "center frequency" and the defined "bandwidth" of an actual oscillator. In practice, the "center frequency," defined "bandwidth," and thus the Q Factor of actual oscillators are assessed by use of a spectrum analyzer.

A spectrum analyzer is device which visually depicts the electrical power of a signal distributed over a range of frequencies. In the visual display portion of a typical spectrum analyzer, such distribution of electrical power in a signal is displayed by means of a graph. The horizontal axis of the graph is marked using units of frequency, and the vertical axis of the graph is marked using units of power per unit of frequency. Using this graph, the power of an actual oscillator's output can be plotted over a range of frequencies. Typically, the power versus frequency plot for an actual oscillator will appear as a "bell shaped" curve with the apex of the "bell shaped" curve corresponding to the "center frequency," as defined above, and with the "bandwidth" consisting of that range of frequencies within which is contained one-half (½) the total power within the output of the oscillator as is represented by the area under the curve.

The better an actual oscillator is, the narrower such oscillator's "bell shaped" curve will appear on a spectrum analyzer. This is true because a higher Q factor generally connotes a smaller defined "bandwidth," which indicates that the majority of electrical energy produced by the oscillator is concentrated about the predefined controlled frequency. With respect to a spectrum analyzer, such higher Q Factors translate to narrower "bell shaped" curves, since the "bandwidth" (frequency band wherein is contained one-half (½) the total power contained within the output of the oscillator) is narrower for higher Q Factors.

In practice, it has been found that one of the most significant factors which broadens, or spreads, the "bandwidth" of an oscillator is the time-domain "jitter" of the oscillator. The mathematically ideal oscillator, described above, produces an output waveform of some predefined controlled frequency. The frequency of a waveform is defined to be one divided by the period of time that elapses between successive wave crests of the output waveform. In the mathematically ideal oscillator the period of time between any two successive wave crests in the mathematically ideal oscillators output waveform is always the same. Unfortunately, this is not the case with actual oscillators.

In actual oscillators, the period of time between any two successive wave crests in an actual oscillator's output waveform varies. In the context of electronic oscillators, the term utilized to describe this phenomenon of abrupt variations in the periods of an oscillator's successive output waveforms is time-domain "jitter."

This "jitter" is responsible for the "spread" of the "bell shaped" curve of an actual oscillator, as such output appears on a spectrum analyzer. That is, because each such variation in period constitutes a wave of different frequency, the power output of the oscillator will appear as spread over the range of frequencies present when such output is viewed via spectrum analyzer. The more numerous the different frequencies produced by the oscillator (i.e., the higher the time-domain "jitter"), the larger the frequency range over which the output of the oscillator is spread, and, consequently, the wider the "bandwidth," and thus the lower the Q Factor of the oscillator. Thus, from the standpoint of oscillator design it is important that such time domain "jitter" be kept as low as practicable in order to provide the best Q Factor possible within design constraints.

As can be seen from the foregoing, both "Q Factor" and time-domain "jitter" are alternate and inverse ways of describing the accuracy of an actual oscillator; that is, a high Q factor implies relatively low time-domain "jitter," and vice versa.

The accuracy required of an actual oscillator is dictated by the application in which the oscillator will be used. One type of application which requires oscillators having significant accuracy is the adaptation of electronic oscillators for use as a clock in a data-processing system.

A clock in the data-processing system is a device that generates periodic, accurately spaced signals used for various purposes such as timing, synchronization, and regulation of the operations of a data processor within the data-processing system, or the generation of interrupts. Since electronic oscillators, by definition, produce periodic accurately spaced signals, it is common to adapt them for use as clocks in data-processing systems.

Both passive and active electronic oscillators are used as clocks in data-processing systems. For data-processing systems requiring clock speeds of 200 MHZ and below, it is common to use active oscillators to provide the clock signal. Typically, such active oscillators are in the form of what are known in the art as "ring oscillators." While there are different forms of "ring oscillators," the basic form of such oscillators is that of differential-type invertors which have gain and/or a total phase delay of a negative one-hundred-eighty (−180) degrees. As stated, such active oscillators tend to work well for clock speeds of 200 MHZ and below; however, for data-processing systems requiring clock speeds greater than 200 MHZ, such active oscillators are generally too inaccurate to provide such required clock speeds in that such active oscillators have unacceptably high levels of time-domain "jitter" and correspondingly low Q factors.

The primary sources of such unacceptably high levels of time-domain "jitter," and correspondingly low Q Factors, are inherent in the components utilized to construct such active oscillators. Under the current state of the art at least one of the primary noise sources cannot be eradicated in that it arises from thermal noise in the inverter transistors, which is a physical property inherent in the materials used to construct the inverter transistors. Furthermore, while a second primary noise source (time-domain "jitter" arising from variations in power supply voltage supplied to the active invertors) can be reduced by careful control of the power supply voltage, it cannot be eradicated and will in fact become a significant source noise at high frequencies (e.g., those frequencies starting in the 600–800 MHZ range and extending to the 1 GHz range and beyond). In addition to these two primary sources of noise, there are additional sources of noise which are also inherent in the components utilized to construct such active oscillators, such as substrate coupling in the oscillator when it is operating on a digital chip, or additional background coupling through the substrate ("ground bounce") which also cannot be eradicated due to the fact that such noise sources are inherent in the components utilized to construct such active oscillators.

Within the art, integrated circuit designs are trending toward lower and lower voltages; for example, integrated circuit designs are currently moving from 1.8 volts to 1.5 volts. This trend makes the previously-noted significant noise contributors even more significant. Present methods attempting to offset such noise contributions have included providing a special supply voltage of 2.4 volts to the oscillator itself. However, such methods begin to fail near the 600–800 MHZ range.

Attempts have been made within the art to develop other types of active oscillators which do not have the foregoing noted the noise source problems. One such type of oscillator that has been developed is the surface acoustical wave (SAW) oscillator. The SAW-type oscillators tend to be very accurate, with very high Q factors. However, such SAW-type oscillators are not without practical problems. For example, (1) SAW-type oscillators generally require a two chip implementation, which can be very inconvenient in a data-processing system context; (2) the SAW-type oscillators are best tuned to frequencies within the 200–800 MHZ range, although some manufacturers are currently offering SAW-type oscillators up to 1.2 GHz; (3) SAW-type oscillators are very sensitive to temperature changes; (4) the frequency output of such SAW-type oscillators tends to vary with temperature; and (5) SAW-type oscillators typically have no tunability, which means they can't account an one-frequency-only formats. Furthermore, SAW-type oscillators tend to be relatively expensive, especially in the very high frequency range.

In light of the foregoing, it is apparent that a need exists for a method and apparatus for creating an improved inductor, capable of being operated at relatively low voltage levels and further capable of being implemented on an integrated circuit chip, which can be adapted for use with an electronic oscillator and which can provide such an oscillator with a relatively high Q factor and correspondingly low time-domain "jitter."

SUMMARY OF THE INVENTION

It is therefore one object of the present invention to provide a method and apparatus for creating an improved inductor, capable of being operated at relatively low voltage levels and further capable of being implemented on an integrated circuit chip, and which can be adapted for use with an electronic oscillator.

It is therefore another object of the present invention to provide a method and apparatus for creating an improved inductor, capable of being operated at relatively low voltage levels and further capable of being implemented on an integrated circuit chip, which can be adapted for use with an electronic oscillator, and which thereby provide an improved Q factor and correspondingly low time-domain jitter for an electronic oscillator.

The objects are achieved by providing a method and apparatus for creating improved inductors which can be adapted for use with electronic oscillators. The present invention relates, in general, to a method and apparatus for creating improved inductors which can be adapted for use with electronic oscillators. The method includes at least the following: forming a first coil; forming a second coil, such that the second coil is proximate to the first coil and such that a magnetic flux from the formed outer coil will link with a magnetic flux of the formed second coil; and connecting the first coil to the second coil in electrical parallel. The apparatus includes at least the following: a substrate; and a composite inductor having at least a first coil with an associated inductance and resistance and a second coil with an associated inductance and resistance, with the first coil and the second coil connected in electrical parallel but formed in the substrate such that said composite inductor has resistance substantially less than the combined resistances associated with the first coil and the second coil. The composite inductor further includes the first coil and second coil connected in electrical parallel but formed in the substrate such that the composite inductor has inductances substantially equivalent to the combined inductances associated with the first coil and the second coil. The apparatus can be utilized to form an oscillator implemented in an integrated circuit.

The above, as well as additional objects, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objects, and advantages thereof, will best be understood by reference to the following detailed description of an illustrative embodiment when read in conjunction with the accompanying drawings, wherein:

DETAILED DESCRIPTION OF THE INVENTION

It was mentioned in the background section that attempts have been made to produce active oscillators which operate at low voltage levels, produce very high frequency tuneable output, and have relatively high Q factors, and correspondingly low time-domain "jitter." It was explained in the background section that neither "ring" nor SAW-type oscillators are currently able to practicably achieve such low voltage levels, very high frequency tuneable outputs, and relatively high Q factors/low time-domain "jitter.".

One embodiment of the present invention achieves such low voltage levels, very high frequency tuneable outputs, and relatively high Q factor/low time-domain "jitter." However, this embodiment utilizes neither the SAW-type oscillator nor "ring" type oscillator. Rather, the embodiment is a method and apparatus which utilize a LC (inductance-capacitance) resonator.

This embodiment takes advantage of inductance and capacitance created within integrated circuits to create an oscillator which acts like a tank circuit. The embodiment produces high frequency oscillation which can be divided down to a usable frequency. The embodiment can be implemented in a CMOS (complementary metal-oxide semiconductor) integrated circuit. The embodiment provides oscillators which operate at low voltages, provide extremely high frequency ranges (including, but not limited to, frequencies extending to 2–4 GHz), have good tunability, relatively low time-domain "jitter," relatively high Q factors, and can currently be implemented in CMOS within a micro-meter area.

Figure 1:
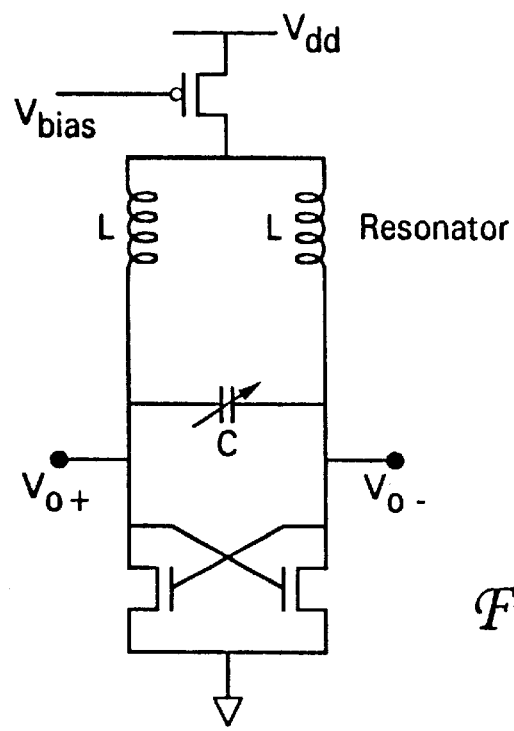
FIG. 1 shows a typical LC oscillator circuit.
Figure 2:
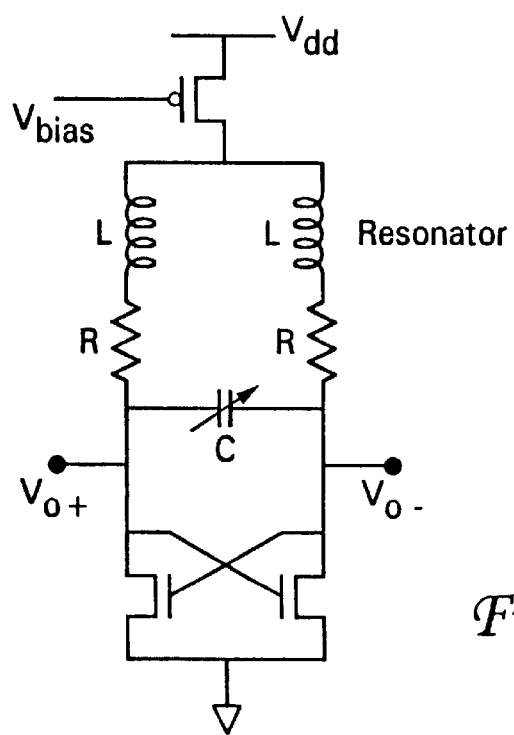
FIG. 2 illustrates a RLC structure.

Refer now to FIG. 1. FIG. 1 shows a typical LC oscillator circuit referred to in the art as a tuned oscillator, or a tuned LC oscillator, or a balanced two-phase tuned LC oscillator. It is desirable to implement the circuit shown in FIG. 1 in an integrated circuit chip. However, but for the present invention such is not practicable because when an attempt is made to implement a large inductor on an integrated circuit chip, there is typically associated with the large inductor a correspondingly large resistance appearing in series with the inductor. Thus, when the attempt is made to actually implement the LC oscillator circuit shown FIG. 1, what is achieved is actually an RLC oscillator circuit, as is shown in FIG. 2, rather than the desired LC oscillator circuit. The unintended resistance, R, has the effect of degrading the Q factor which would have been achieved had the unintended resistance not been present (that is, had only the LC components been present). It is essentially the unintended resistance, R, which makes the implementation of such passive LC oscillators circuits impracticable but for embodiments of the present invention.

As has been discussed, the objective is to the achieve an implementation of a typical LC oscillator circuit as shown in FIG. 1 in an integrated circuit chip, but without the attendant resistance as is illustrated in FIG. 2. It has been determined that a practicable approximation of the LC oscillator circuit shown in FIG. 1 can be achieved by finding a way to achieve relatively high levels of inductance, L, while keeping the resistance, R, relatively low.

It was noted in the introduction that the objective in building active oscillators is to achieve as close an approximation to mathematically ideal oscillators as is possible. Mathematically ideal oscillators have all their energy concentrated at the predefined controlled frequency (i.e., have no time-domain jitter) and thus have infinite Q factor (perfection is as good as it gets). However, for parallel resonant circuits (or, equivalently, RLC oscillators) such as that shown in FIG. 2, the mathematical formula for the Q factor of such circuits, or oscillators, is approximated by the following equation $$Q = \omega_0 * L/R \qquad (1)$$

Thus, equation 1 makes clear that in order to closely approximate a mathematically ideal oscillator, it is desirable to achieve large inductance, L, and small resistance, R. The present invention makes large L or small R possible. An embodiment where this has been achieved is set forth below.

The embodiment involves a solenoidal configuration in which the solenoidal structures are situated in a horizontal direction relative to an integrated circuit chip, and which can contain parallel arrays of such solenoidal ring configurations.

Figure 3A:
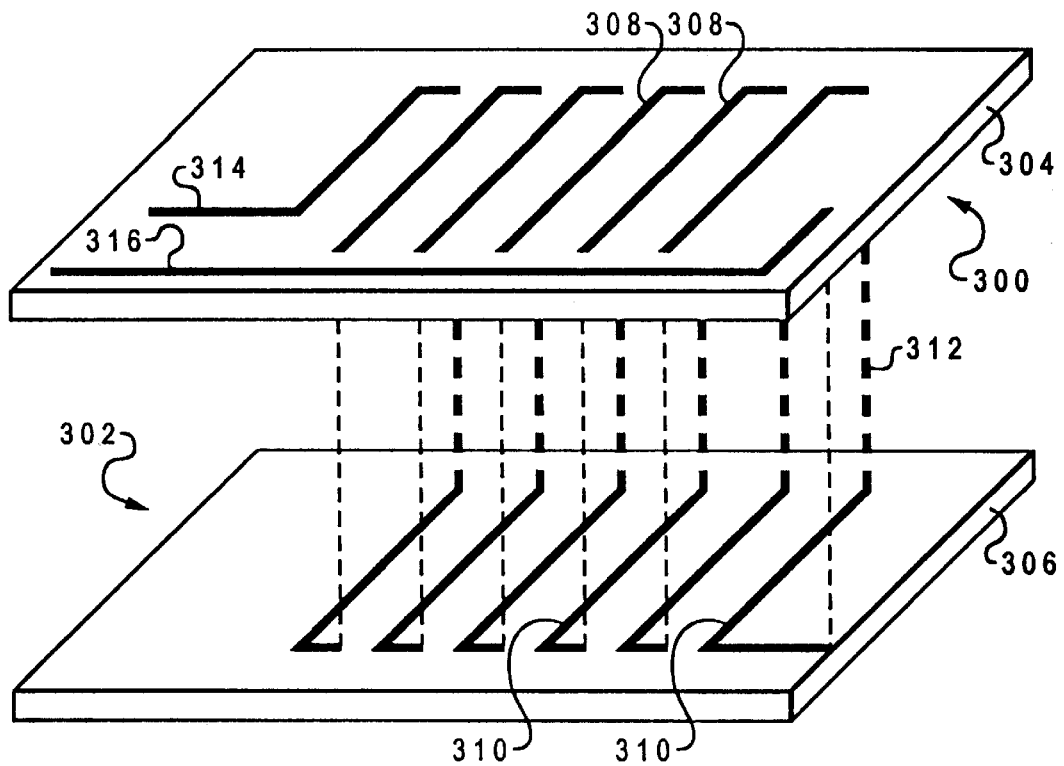
FIG. 3A illustrates a perspective drawing of a solenoidal inductor 300 implemented in layered integrated circuit substrate material 302 (e.g., CMOS)
Figure 3B:
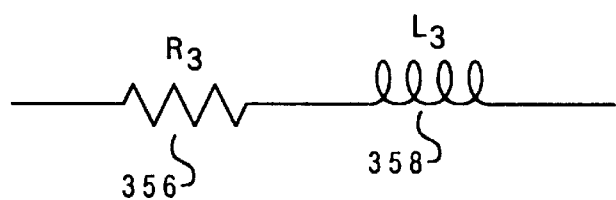
FIG. 3B shows a circuit diagram associated with solenoidal inductor 300 illustrated in FIG. 3A.

Refer now to FIGS. 3A and 3B. FIG. 3A illustrates a perspective drawing of a solenoidal inductor 300 implemented in layered integrated circuit substrate material 302 (e.g., CMOS) Shown is that solenoidal inductor 300 is composed of elements in two metallic layers 304 and 306, with each inductor turn being composed of an upper metallic layer portion 308 and a lower metallic portion 310 connected by vias 312. Shown is that integrated circuit 300 can be energized by surface lines 314 and 316.

It will be understood by those within the art that, but for the present invention, when an attempt to implement solenoidal inductor 300 is made such that solenoidal inductor 300 has a significant magnitude of inductance, severe problems associated with resistance arise. That is, for significant magnitudes of inductance, multiple solenoidal turns are needed, but each individual solenoidal turn adds a significant resistive contribution to the total resistance present.

Refer now to FIG. 3B. FIG. 3B shows a circuit diagram associated with solenoidal inductor 300 illustrated in FIG. 3A. Shown is that the solenoidal inductor has resistance R3 356 and inductance L3 358 when driven by current source 309 operating at some defined magnitude and frequency.

FIGS. 4A, 4B, 4C, and 4D illustrate one embodiment of the present invention that produces a new type of solenoidal inductor which can be utilized to produce Q factor enhancement of LC oscillators. The embodiment of FIGS. 4A, 4B, 4C, and 4D achieves this by making it possible to produce a good solenoidal inductor with high inductance and very low resistance.

Figure 4A:
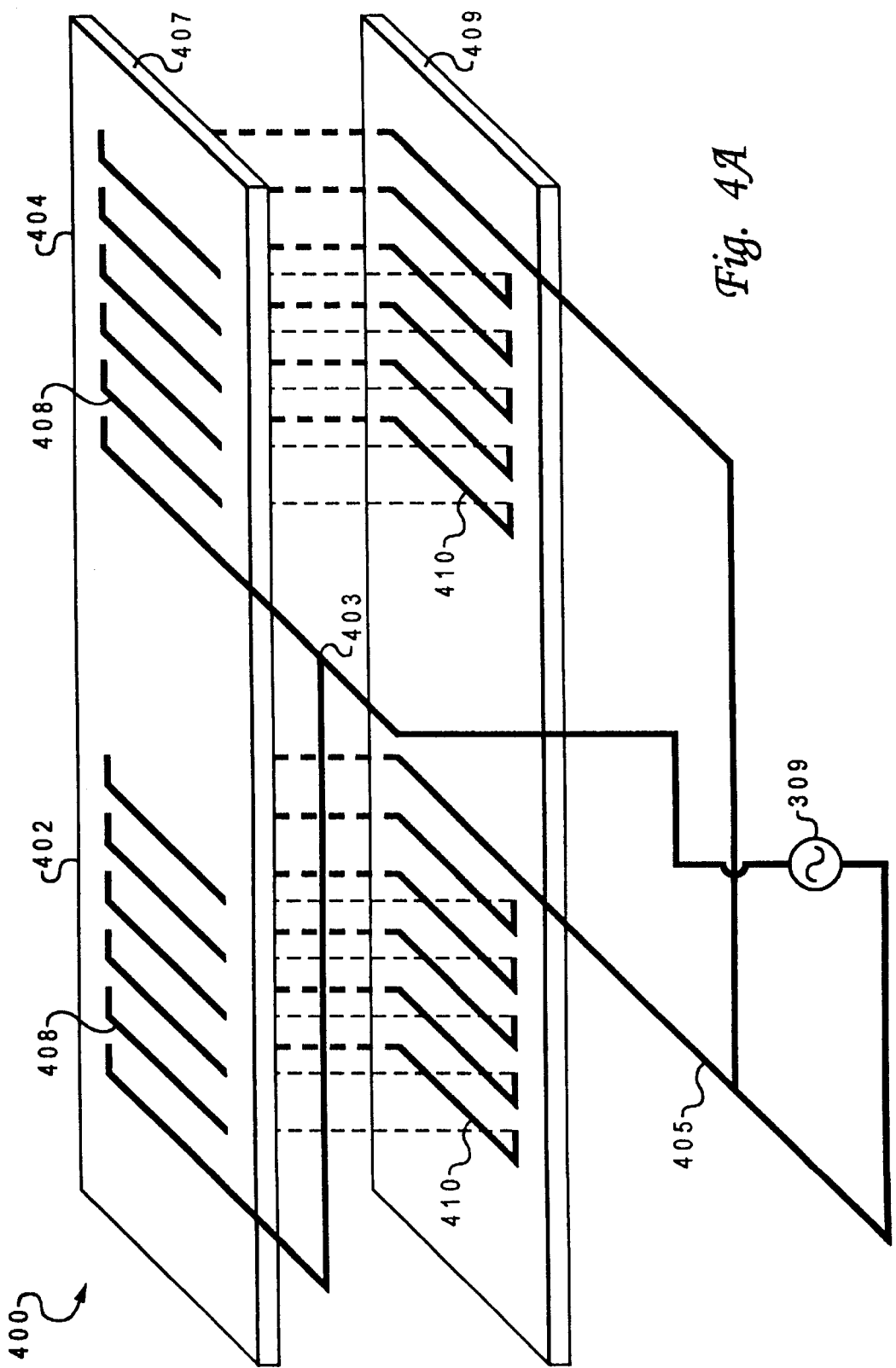
FIG. 4A shows an overhead perspective view of a solenoidal inductor, modified in accord with the present invention.

Refer now to FIG. 4A. FIG. 4A shows an overhead perspective view of a solenoidal inductor, modified in accord with an embodiment of the present invention. Shown in FIG. 4A is a composite solenoidal inductor 400. Composite solenoidal inductor 400 is composed of a first solenoidal coil 402 and a second solenoidal coil 404. First solenoidal coil 402 and second solenoidal coil 404 are geometrically arranged end to end and such that their upper metallic portions 408 and lower metallic portions 410 are in the same metallic planes 407 and 409, respectively.

Shown is that first solenoidal coil 402 and second solenoidal coil 404 may be energized by current source 309 through surface line 403 and 405.

In a first and a second (e.g., a 16-turn and 32-turn) embodiment, the solenoid coils (e.g., first solenoidal coil 402 and second solenoidal coil 404) are constructed using an upper metallic layer, two lower metallic layers (wherein each lower metallic layer contributes physically parallel metallic portions (or wires) which are electrically parallel connected such that each such parallel connected pair of wires forms a bottom (or lower layer(s)) portion of an individual turn within each solenoidal coil), and tungsten vias. The widths of the solenoid coil wires are 5 micrometers and the spacing between the turns is 0.5 micrometers. The area dimensions for 16-turn and 32-turn solenoidal embodiments are 132×88 micro-meter$^2$ and 132×176 micro-meter$^2$, respectively. In a third and a fourth embodiment, the entire interconnection system of the 16-turn and 32-turn inductors, including the tungsten vias, is replaced by copper in an all-copper process. Furthermore, it is to be understood that each of the foregoing described embodiments can be incorporated into a two-phase LC oscillator in a fashion similar to that shown in FIG. 5A, below. With respect to the incorporation of the embodiments into a two phase oscillator, it has been found preferable to utilize cross-coupled n-channel transistors and a p-channel current source in implementing the two-phase LC oscillator which are 100 micro-meters and 500 micro-meters wide, respectively. It will be recognized by those within the art that the metallic layers discussed are conceptually analogous to metallic planes 407 and 409 discussed above.

Figure 4B:
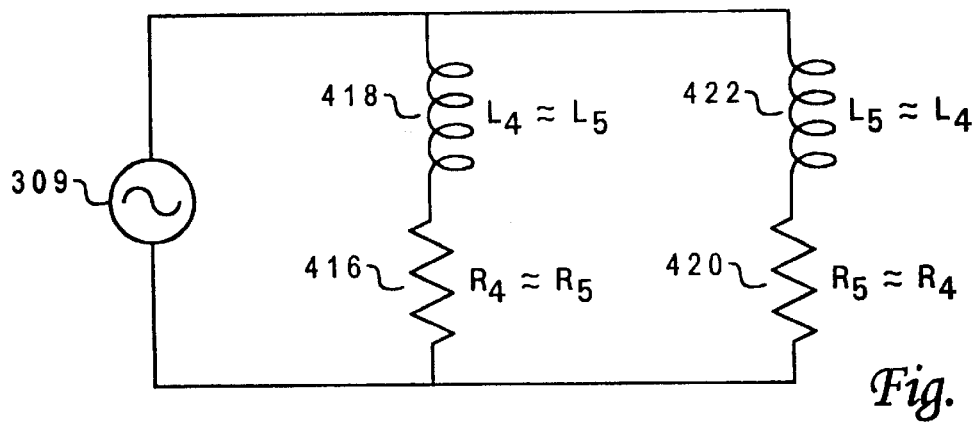
FIG. 4B illustrates a circuit diagram associated with solenoidal inductor 400 illustrated in FIG. 4A.

FIG. 4B illustrates a circuit diagram associated with composite solenoidal inductor 400 illustrated in FIG. 4A. Shown is that first solenoidal coil 402 has resistance R4 416 and inductance L4 418 when excited by current source 309 operating at some defined magnitude and frequency. Also shown is that second solenoidal coil 404 has resistance R5 420 and inductance L5 422 when excited by current source 309 operating at some defined magnitude and frequency. For sake of illustration, it will be assumed that the magnitudes of resistances R4 416, and R5 420 are roughly equivalent; it will also be assumed that the magnitudes of inductances L4 418, and L5 422 are roughly equivalent.

Those skilled in the art will recognize that first solenoidal coil 402 and second solenoidal coil 404 are connected in electrical parallel. As will be understood by those within the art, when solenoids are connected in electrical parallel and excited by a time-varying source (such as current source 309), a resultant impedance is produced which is equal to the reciprocal of the sum of the reciprocals of the complex impedances of the inductances in parallel (however, those skilled in the art will recognize that, assuming the inductances (Ls) and resistances (Rs) of the two solenoids connected in electrical parallel are roughly equal, a good approximation of the resultant impedance will be that of a series resistive-inductive element roughly equal to the individual inductances of the solenoids divided by two (L/2) and individual resistances of the solenoids divided by two (R/2).

It has been found empirically that when you organize the solenoids as shown in FIG. 4A and construct the solenoids from preferred materials in the fashion explained above, the magnetic flux of first solenoid 402 is coupled to the magnetic flux of second solenoid 404 such that the net inductance of the solenoids connected in electrical parallel is now twice normal. That is, assuming that individual solenoids have roughly equivalent individual inductances L, the effective inductance of each of the solenoids connected in electrical parallel is 2L. The effective resistance of each of the solenoids connected in parallel is, however, the resistance of the individual solenoids.

It has been found that in a preferred embodiment, a key feature is to couple flux among as many turns in parallel as is practicable. This is achieved by placing first solenoidal coil 402 and second solenoidal coil 404 as close as is empirically practicable.

Figure 4C:
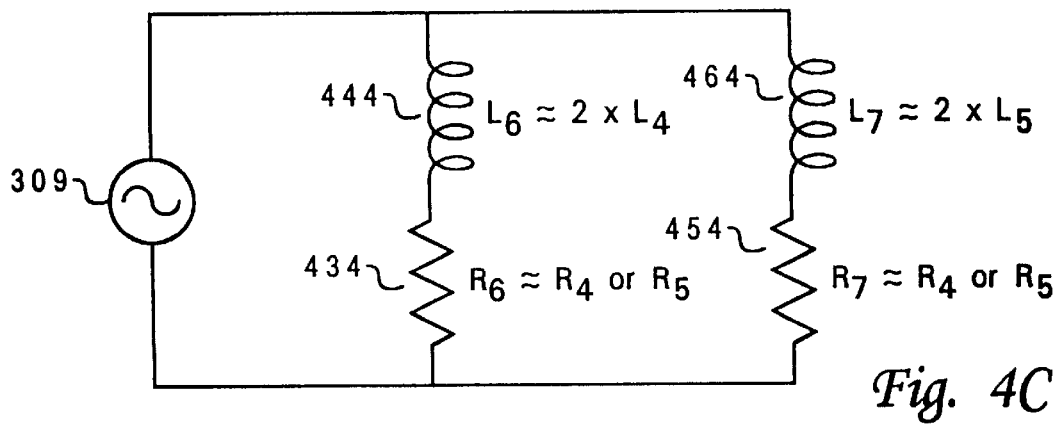
FIG. 4C shows an unexpected circuit diagram of one embodiment of the present invention, constructed as the circuit shown in FIG. 4A.

Refer now to FIG. 4C. FIG. 4C shows an unexpected circuit diagram of one embodiment of the present invention, constructed as the circuit shown in FIG. 4A and as described above. Shown is that first solenoidal coil 402 has resistance R6 434 approximately equal to the magnitude of either R4 416 or R5 420, and an inductance L6 444 approximately equal to twice (2×) the magnitude of either L4 48 or L5 422. Also shown is that second solenoidal coil 404 has an inductance L7 464 approximately equal to twice (2×) the magnitude of either L4 418 or L5 422 and a resistance R7 464 approximately equal to the magnitude of either R4 416 or R5 420.

Figure 4D:
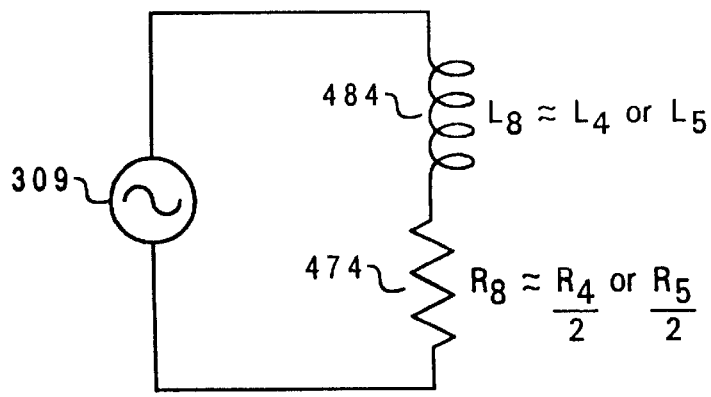
FIG. 4D shows an unexpected resultant circuit diagram of one embodiment of the present invention, constructed as the circuit shown in FIG. 4A.

Refer now to FIG. 4D. FIG. 4D shows an unexpected resultant circuit diagram of one embodiment of the present invention, constructed as the circuit shown in FIG. 4A.

Shown that, due to the surprising result demonstrated in FIG. 4C, and utilizing the rough equivalency of nearly identical resistive-inductive elements in parallel as was discussed above, the parallel inductor pair can be replaced with the roughly equivalent circuit shown which has resistance R8 474 approximately equal to one-half (½) the magnitudes of either R4 416 or R5 420, and an inductance L8 484 approximately equal to the magnitude of either L4 48 or L8 412. Consequently, the equivalent circuits of FIGS. 4D and 4B, when viewed in light of equation 1, show that the use of composite solenoidal inductor 400 results in an oscillator with a Q roughly two times (2×) that of an oscillator utilizing as its inductive element either solenoidal coil 402 or solenoidal coil 404. Such an oscillator will now be illustrated with reference to FIGS. 5A and 5B.

Figure 5A:
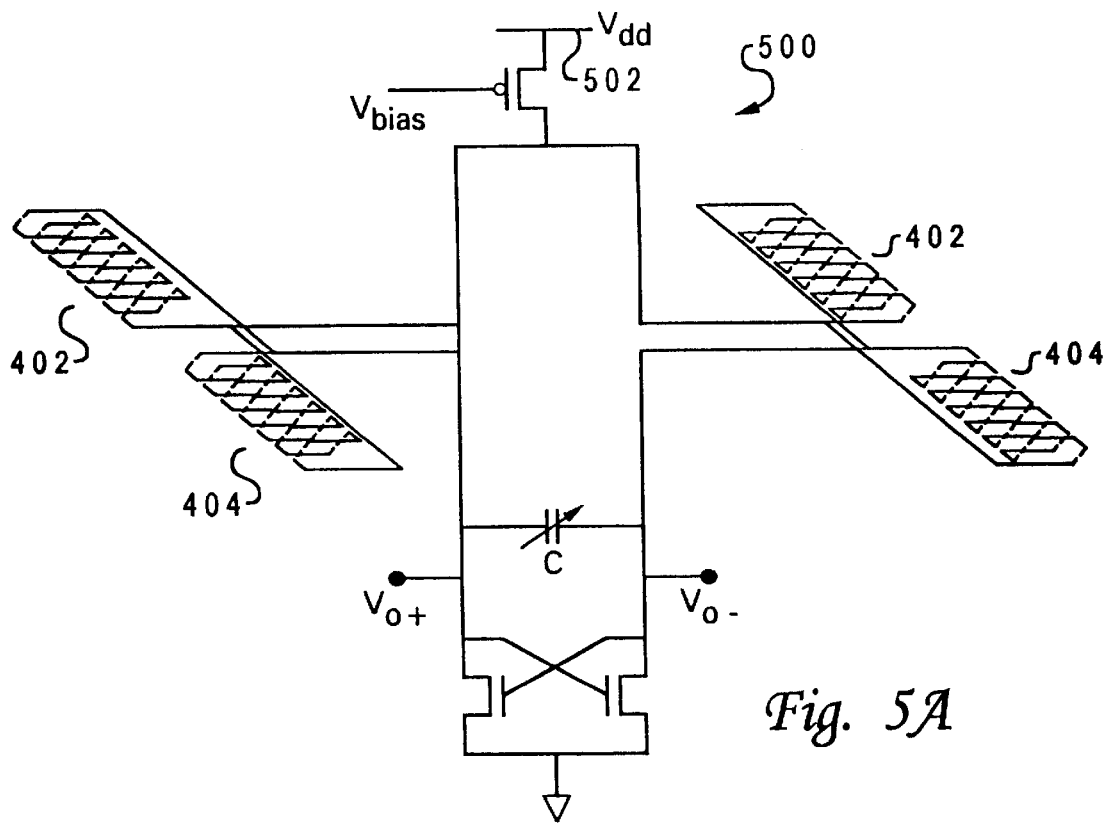
FIG. 5A depicts a partially schematic circuit diagram which shows how the embodiment set forth as described in relation to FIGS. 4A–4D can be utilized to provide an improved LC oscillator.

Refer to FIG. 5A. FIG. 5A depicts a partially schematic circuit diagram which shows how the embodiment set forth as described in relation to FIGS. 4A–4D can be utilized to provide an improved LC oscillator. Shown in FIG. 5A is LC oscillator 500. LC oscillator 500 is essentially the oscillator shown in FIG. 2, but with the resistive-inductive elements of the oscillator of FIG. 2 replaced with the embodiment set forth in FIG. 4A. In the oscillator, the first solenoid coil $V_{dd}$ 502 supplies current through the first solenoid coil 402 and second solenoidal coil 404 pairs to the rest of the oscillator structure.

In FIG. 5A, first solenoidal coil 402 and second solenoidal coil 404 are shown in plan view. The rest of LC oscillator 500 is as was illustrated in FIG. 2.

Figure 5B:
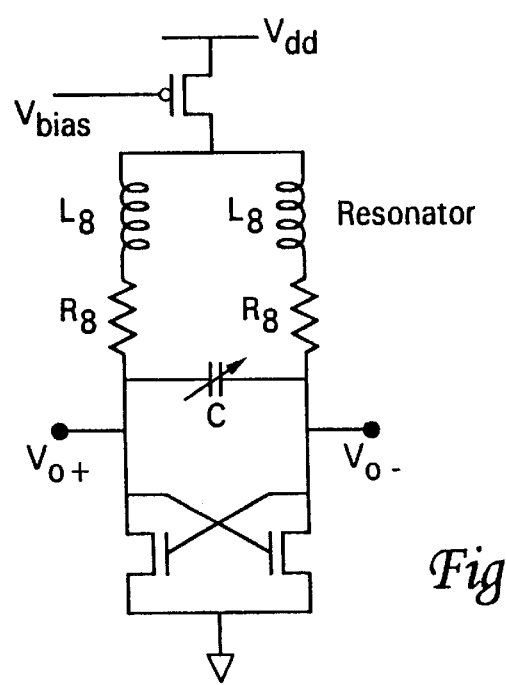
FIG. 5B illustrates the circuit diagram equivalent to the partially schematic circuit diagram of FIG. 5A.

Refer to FIG. 5B. FIG. 5B illustrates the circuit diagram equivalent to the partially schematic circuit diagram of FIG. 5A. Shown is that the resulting circuit diagram is essentially the same as that of the FIG. 2, but with the resistive-inductive elements of the circuit diagram shown FIG. 2 replaced with the resulting resistive-inductive element equivalent circuit shown in FIG. 4D.

While the invention has been shown and described with reference to particular embodiments thereof, it will be understood by those skilled in the art that the foregoing and other changes in form and detail may be made therein without departing from the spirit and scope of the invention, which is defined only by the following claims.

What is claimed is:

1. An integrated circuit comprising:
    a substrate; and
    a composite inductor having at least a first coil with an associated inductance and resistance and a second coil with an associated inductance and resistance, with the first coil and the second coil connected in electrical parallel but formed in said substrate such that said composite inductor has resistance substantially less than the combined resistances associated with the first coil and the second coil.

2. The integrated circuit of claim 1, wherein said composite inductor further includes the first coil and second coil connected in electrical parallel but formed in said substrate such that said composite inductor has inductances substantially equivalent to the combined inductances associated with the first coil and the second coil.

3. The integrated circuit of claim 1, wherein the first coil further includes a first solenoidal coil, having a first and a second end, formed in said substrate.

4. The integrated circuit of claim 3, wherein the second coil further includes a second solenoidal coil, having a first and a second end, formed in said substrate.

5. The integrated circuit of claim 4, wherein said composite inductor with the first coil and the second coil connected in electrical parallel but formed in said substrate such that said composite inductor has resistance substantially less than resistances associated with the first coil and the second coil further includes:
    the first and said second solenoidal coil formed in said substrate such that the first and said second solenoidal coils are arranged proximately such that said first solenoidal coil will magnetically link to said second solenoidal coil such that the inductance associated with said composite inductor is substantially the same as the inductances associated with said first solenoidal coil and said second solenoidal coil, while the resistance associated said composite inductor is substantially less than the resistances associated with said first solenoidal coil and said second solenoidal coil.

6. The integrated circuit of claim 5, wherein the first and said second solenoidal coil formed in said substrate such that the first and said second solenoidal coils are arranged proximately such that said first solenoidal coil will magnetically link to said second solenoidal coil further include forming said first solenoidal coil and the second said second solenoidal coil in said substrate such that the second end of said first solenoidal coil is substantially adjacent to the first end of said second solenoidal coil.

7. The integrated circuit of claim 2, further comprising at least one capacitor formed in said substrate such that said at least one capacitor is in electrical series with said composite inductor and such that an electronic oscillator is formed.

8. The integrated circuit of claim 2, wherein the first and the second coil further comprise at least one tungsten via.

9. The integrated circuit of claim 2, wherein the first and the second coil further comprise at least one copper via.

10. An oscillator implemented in an integrated circuit, said oscillator comprising:
    a substrate;
    a composite inductor having at least a first coil with an associated inductance and resistance and a second coil with an associated inductance and resistance, with the first coil and the second coil connected in electrical parallel but formed in said substrate such that said composite inductor has resistance substantially less than the combined resistances associated with the first coil and the second coil; and
    at least one capacitor formed in said substrate such that said at least one capacitor is an electrical series with said composite inductor and such that an electronic oscillator is formed.

11. The oscillator of claim 10, wherein said composite inductor further includes the first coil and second coil connected in electrical parallel but formed in said substrate such that said composite inductor has inductances substantially equivalent to the combined inductances associated with the first coil and the second coil.

12. The oscillator of claim 10, wherein the first coil further includes a first solenoidal coil, having a first and a second end, formed in said substrate.

13. The oscillator of claim 12, wherein the second coil further includes a second solenoidal coil, having a first and a second end, formed in said substrate.

14. The oscillator of claim 13, wherein said composite inductor with the first coil and the second coil connected in electrical parallel but formed in said substrate such that said composite inductor has resistance substantially less than resistances associated with the first coil and the second coil further includes:
    the first and said second solenoidal coil formed in said substrate such that the first and said second solenoidal coils are arranged proximately such that said first solenoidal coil will magnetically link to said second solenoidal coil such that the inductance associated with said composite inductor is substantially the same as the inductances associated with said first solenoidal coil and said second solenoidal coil, while the resistance associated said composite inductor is substantially less than the resistances associated with said first solenoidal coil and said second solenoidal coil.

15. The oscillator of claim 14, wherein the first and said second solenoidal coil formed in said substrate such that the first and said second solenoidal coils are arranged proximately such that said first solenoidal coil will magnetically link to said second solenoidal coil further include forming said first solenoidal coil and the second said second solenoidal coil in said substrate such that the second end of said first solenoidal coil is substantially adjacent to the first end of said second solenoidal coil.

16. The oscillator of claim 11, further comprising at least one capacitor formed in said substrate such that said at least one capacitor is in electrical series with said composite inductor and such that an electronic oscillator is formed.

17. The oscillator of claim 11, wherein the first and the second coil further comprise at least one tungsten via.

18. The oscillator of claim 11, wherein the first and the second coil further comprise at least one copper via.

19. A method for creating a composite inductor from a first coil having an associated inductance and resistance and a second coil having an associated inductance and resistance by placing the first and the second coil in electrical parallel such that the composite inductor has resistance substantially less than the combined resistances of the first and the second coil and inductance substantially equivalent to the combined inductances of the first and the second coil, said method comprising steps of:

forming a first coil;

forming a second coil, such that said second coil is proximate to said first coil and such that a magnetic flux from said formed first coil will link with a magnetic flux of said formed second coil; and connecting said first coil to said second coil in electrical parallel.

20. The method of claim 19, wherein said step of forming the first coil further includes the step of forming a first solenoidal coil in a substrate.

21. The method of claim 20, wherein said step of forming the second coil proximate to said first coil further includes the step of forming in a substrate a second solenoidal coil proximate to, and whose axis is parallel with the axis of, said formed first solenoidal coil.

22. The method of claim 19, wherein said step of forming the first coil and the second coil further includes the step of forming in a substrate both the first and the second coil utilizing at least one tungsten via.

23. The method of claim 19, wherein said step of forming the first coil and the second coil further includes the step of forming in a substrate both the first and the second coil utilizing at least one copper via.

24. The method of claim 19, wherein said step of forming the first coil and the second coil further includes the step of forming in a substrate both the first and the second coil utilizing an all copper process.

25. The method of claim 19, further comprising incorporating said connected first and second coil into an LC oscillator.

* * * * *